(12) United States Patent
Magnani

(10) Patent No.: US 10,219,005 B2
(45) Date of Patent: Feb. 26, 2019

(54) SYSTEM AND METHOD FOR REAL-TIME COMPRESSION OF DATA FRAMES

(71) Applicant: HCL Technologies Italy S.p.A., Vimodrone (Milan) (IT)

(72) Inventor: Alessandro Magnani, Milan (IT)

(73) Assignee: HCL Technologies Italy S.p.A., Vimodrone (Milan) (IT)

( * ) Notice: Subject to any disclaimer, the term of this patent is extended or adjusted under 35 U.S.C. 154(b) by 44 days.

(21) Appl. No.: 15/636,276

(22) Filed: Jun. 28, 2017

(65) Prior Publication Data

US 2019/0007704 A1    Jan. 3, 2019

(51) Int. Cl.
| | |
|---|---|
| *H04N 19/61* | (2014.01) |
| *H04N 19/169* | (2014.01) |
| *H04N 19/18* | (2014.01) |
| *H04N 19/40* | (2014.01) |
| *H04N 19/42* | (2014.01) |
| *H04N 19/102* | (2014.01) |
| *H04N 19/96* | (2014.01) |
| *H04N 19/593* | (2014.01) |

(52) U.S. Cl.
CPC ........... *H04N 19/61* (2014.11); *H04N 19/169* (2014.11); *H04N 19/102* (2014.11); *H04N 19/18* (2014.11); *H04N 19/40* (2014.11); *H04N 19/42* (2014.11); *H04N 19/593* (2014.11); *H04N 19/96* (2014.11)

(58) Field of Classification Search
CPC .... H04N 19/61; H04N 19/169; H04N 19/102; H04N 19/18; H04N 19/40; H04N 19/42; H04N 19/593; H04N 19/96
See application file for complete search history.

(56) References Cited

U.S. PATENT DOCUMENTS

| | | | | |
|---|---|---|---|---|
| 5,650,783 | A * | 7/1997 | Murashita | G06T 9/005 341/107 |
| 8,497,788 | B1 | 7/2013 | Miller et al. | |
| 9,503,122 | B1 | 11/2016 | Henry et al. | |
| 2014/0210652 | A1* | 7/2014 | Bartnik | H03M 7/40 341/67 |
| 2015/0280739 | A1* | 10/2015 | Dunayer | H03M 7/40 341/67 |

* cited by examiner

*Primary Examiner* — Anner N Holder
(74) *Attorney, Agent, or Firm* — HMLG Law Group LLP; Vani Moodley, Esq.

(57) ABSTRACT

The present disclosure relates to system(s) and method(s) for real time compression of a data frame. The system receives the data frame comprising a set of symbols. Further, the system identifies frequency of each symbol, from the set of symbols. The system further sorts the symbols in descending order of frequency, associated with each symbols. Further, the system computes a compression gain associated with each predefined case type, a set of predefined case types. Furthermore, the system selects a target predefined case type, based on the comparison of the compression gain of each predefined case types. The system further assigns a compressed code to Most Frequent Symbols (MFS), in the data frame. The compressed code is assigned based on the target predefined case type. Further, the system generates a compressed frame, associated with the data frame. The compressed frame comprises a header and a sequence of compressed symbols.

15 Claims, 5 Drawing Sheets

| Target predefined Case type (3 bits) (301) | MFS and Compressed code of MFS (0/32 bytes) (302) | Sequence of compressed symbols (303) |

Figure 3

SYSTEM AND METHOD FOR REAL-TIME COMPRESSION OF DATA FRAMES

CROSS-REFERENCE TO RELATED APPLICATIONS AND PRIORITY

The present application does not claim priority from any patent application.

TECHNICAL FIELD

The present disclosure in general relates to the field of data processing. More particularly, the present invention relates to a system and method for real-time compression of data frames.

BACKGROUND

Generally, transmission of data from a transmitter device to a receiver device takes a lot of time. This is due to the bandwidth and processing power limitations of the communication network. Thus, some data compression techniques are used to compress the data before data transmission. The data compression techniques are used to save data storage space. The data compression techniques also help to increase the effective data transfer rate between transmitter and receiver. Some frequently used data compression techniques are Huffman coding and Truncated Huffman coding. In the Huffman coding technique, a Huffman tree is generated and variable length code is assigned to each source symbol present in a data frame. In truncated Huffman coding, bit codes are assigned to a particular set of source symbols, from the data frame, using the Huffman coding.

Further, both of these data compression techniques requires many clock cycles, memory capacity and logic resources in order to generate the Huffman tree and compress the data. Also, these data compression techniques comprise generation of tree and assigning bit code to the symbols. Thus, these data compression techniques are complex. It may take a lot of time to compress the data using these data compression techniques, if there exists huge amount of data. Moreover, for small data frames, the tree information may require too much data to be transmitted, decreasing the overall compression efficiency. Thus, it may not be appropriate to use these data compression techniques for real-time applications.

SUMMARY

Before the present systems and methods for real-time compression of a data frame, are described, it is to be understood that this application is not limited to the particular systems, and methodologies described, as there can be multiple possible embodiments which are not expressly illustrated in the present disclosure. It is also to be understood that the terminology used in the description is for the purpose of describing the particular versions or embodiments only, and is not intended to limit the scope of the present application. This summary is provided to introduce concepts related to systems and methods for real-time compression of a data frame. This summary is not intended to identify essential features of the claimed subject matter nor is it intended for use in determining or limiting the scope of the claimed subject matter.

In one implementation, a method for real-time compression of a data frame is illustrated. The method may comprise receiving a data frame. In one aspect, the data frame may comprise a set of symbols. Further, length of each symbol, from the set of symbols, may be m bits. Further, the method may comprise identifying a frequency associated with each symbol. The frequency, associated with each symbol, may correspond to a number of occurrence of the symbol in the data frame. The method may further comprise sorting the set of symbols to generate a sorted set of symbols. In one embodiment, the sorted set of symbols may be generated based on descending order of frequency associated with each symbol, from the set of symbols. Further, the method may comprise computing a compression gain. The compression gain may be associated with each predefined case type, from a set of predefined case types. In one embodiment, each predefined case type may correspond to a number of bits (C) used to represent first ($2^C-1$) symbols from the sorted set of symbols. Furthermore, the method may comprise selecting a target predefined case type, from the set of predefined case types. In one aspect, the target predefined case type may be selected based on comparison of the compression gain associated with each predefined case type. In one aspect, the target predefined case type may correspond to Ct bits. Once the target predefined case type is selected, the method may comprise assigning Ct bits compressed code to the first ($2^{Ct}-1$) symbols, from the sorted set of symbols. Further, the method may comprise assigning (m+Ct) bits code to the remaining symbols, from the sorted set of symbols. Upon assigning the bit code, the method may comprise generating a compressed frame. In one embodiment, the compressed frame may comprise a header and a sequence of compressed symbols. In one aspect, the sequence of compressed symbols is generated based on the bit code assigned to each symbol. Further, the header may represent the target predefined case type, and the first ($2^{Ct}-1$) symbols.

In another implementation, a system for real-time compression of a data frame is illustrated. The system comprises a memory and a processor coupled to the memory, further the processor is configured to execute programmed instructions stored in the memory. In one embodiment, the processor may execute programmed instructions stored in the memory for receiving a data frame. In one aspect, the data frame may comprise a set of symbols. Further, length of each symbol, from the set of symbols, may be m bits. Further, the processor may execute programmed instructions stored in the memory for identifying a frequency associated with each symbol. The frequency, associated with each symbol, may correspond to a number of occurrence of the symbol in the data frame. Once the frequency is identified, the processor may execute the programmed instructions stored in the memory for sorting the set of symbols to generate a sorted set of symbols. In one embodiment, the sorted set of symbols may be generated based on descending order of frequency associated with each symbol, from the set of symbols. Further, the processor may execute the programmed instructions stored in the memory for computing a compression gain. The compression gain may be associated with each predefined case type, from a set of predefined case types. In one embodiment, each predefined case type may correspond to a number of bits (C) used to represent first ($2^C-1$) symbols from the sorted set of symbols. Furthermore, the processor may execute the programmed instructions stored in the memory for selecting a target predefined case type, from the set of predefined case types. In one aspect, the target predefined case type may be selected based on comparison of the compression gain associated with each predefined case type. In one aspect, the target predefined case type may correspond to Ct bits. Once the target predefined case type is selected, the processor may execute the programme instructions stored in the memory for assigning Ct bits compressed code to the first ($2^{Ct}-1$) symbols, from the sorted set of symbols. Further, the processor may execute the programmed instructions stored in the memory for assigning (m+Ct) bits code to the remaining symbols, from the sorted set of symbols. Upon assigning the bit code, the processor may execute the programmed instructions stored in the memory for generating a compressed frame. In one embodiment, the compressed frame may comprise a header and a sequence of compressed symbols. In one aspect, the sequence of compressed symbols is generated based on the bit code assigned to each symbol. Further, the header may represent the target predefined case type, and the first ($2^{Ct}-1$) symbols.

In yet another implementation, a computer program product having embodied computer program for real-time compression of a data frame is disclosed. The program may comprise a program code for receiving a data frame. In one aspect, the data frame may comprise a set of symbols. Further, length of each symbol, from the set of symbols, may be m bits. Further, the program may comprise a program code for identifying a frequency associated with each symbol. The frequency, associated with each symbol, may correspond to a number of occurrence of the symbol in the data frame. The program may further comprise a program code for sorting the set of symbols to generate a sorted set of symbols. In one embodiment, the sorted set of symbols may be generated based on descending order of frequency associated with each symbol, from the set of symbols. Further, the program may comprise a program code for computing a compression gain. The compression gain may be associated with each predefined case type, from a set of predefined case types. In one embodiment, each predefined case type may correspond to a number of bits (C) used to represent first ($2^C-1$) symbols from the sorted set of symbols. Furthermore, the program may comprise a program code for selecting a target predefined case type, from the set of predefined case types. In one aspect, the target predefined case type may be selected based on comparison of the compression gain associated with each predefined case type. In one aspect, the target predefined case type may correspond to Ct bits. Once the target predefined case type is selected, the program may comprise a program code for assigning Ct bits compressed code to the first ($2^{Ct}-1$) symbols, from the sorted set of symbols. Further, the program may comprise the program code for assigning (m+Ct) bits code to the remaining symbols, from the sorted set of symbols. Upon assigning the bit code, the program may comprise a program code for generating a compressed frame. In one embodiment, the compressed frame may comprise a header and a sequence of compressed symbols. In one aspect, the sequence of compressed symbols is generated based on the bit code assigned to each symbol. Further, the header may represent the target predefined case type, and the first ($2^{Ct}-1$) symbols.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

FIG. 3 illustrates communication protocol for generating a compressed frame, in accordance with an embodiment of the present subject matter.

DETAILED DESCRIPTION

Figure 1:
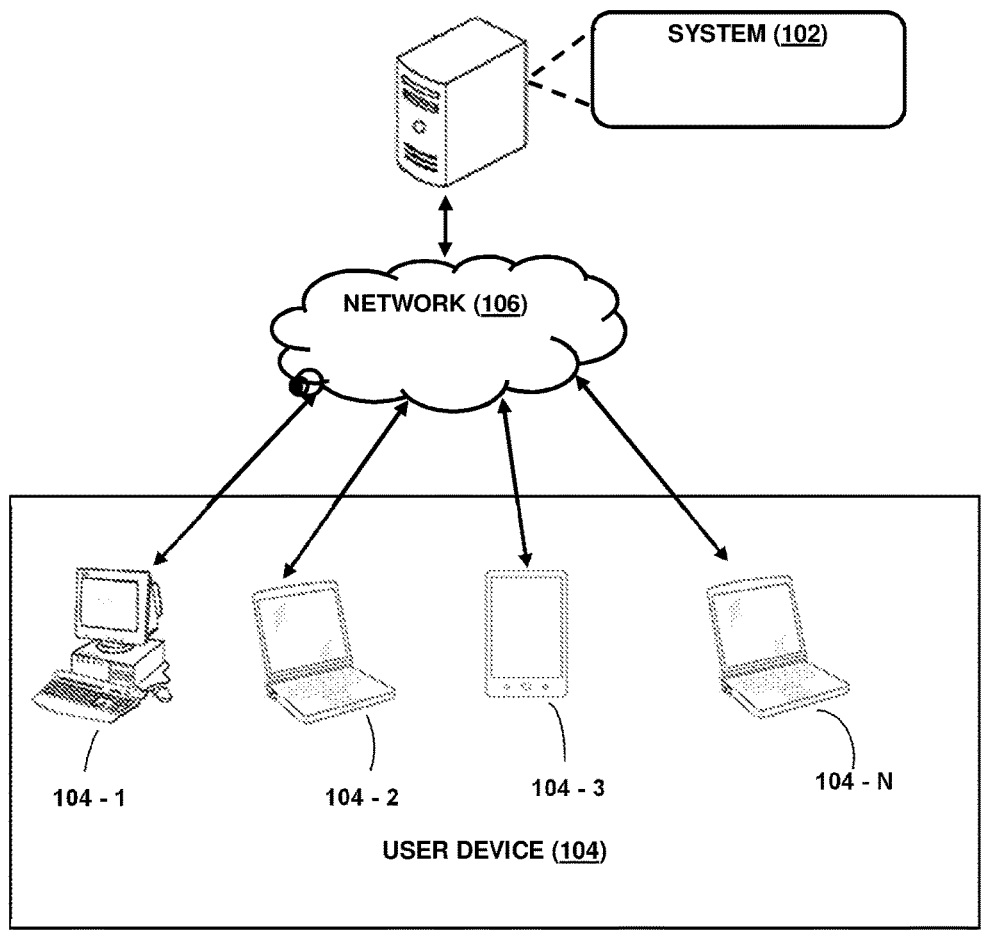
FIG. 1 illustrates a network implementation of a system for real-time compression of a data frame, in accordance with an embodiment of the present subject matter.

Some embodiments of the present disclosure, illustrating all its features, will now be discussed in detail. The words "receiving", "identifying", "sorting", "computing", "selecting", "assigning" and "generating", and other forms thereof, are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a", "an" and "the" include plural references unless the context clearly dictates otherwise. Although any systems and methods similar or equivalent to those described herein can be used in the practice or testing of embodiments of the present disclosure, the exemplary, systems and methods for real-time compression of a data frame are now described. The disclosed embodiments of the system and method for real-time compression of a data frame are merely exemplary of the disclosure, which may be embodied in various forms.

Various modifications to the embodiment will be readily apparent to those skilled in the art and the generic principles herein may be applied to other embodiments. However, one of ordinary skill in the art will readily recognize that the present disclosure for real-time compression of a data frame is not intended to be limited to the embodiments illustrated, but is to be accorded the widest scope consistent with the principles and features described herein.

Nowadays, the most commonly used data compression techniques are Huffman coding and Truncated Huffman coding. The Huffman coding technique comprise two major steps. First step of the Huffman coding technique corresponds to the generation of a Huffman tree and second step of the Huffman coding technique corresponds to assigning bit code to each input character, from a set of input characters, based on traversing the Huffman tree. In the first step, frequency of occurrence of each input character may be computed. Further, the Huffman tree may be generated based on frequency of occurrence of each input character. Further to the generation of the Huffman tree, the Huffman tree may be traversed starting from root and the bit code may be assigned to each input character based on traversing of the Huffman tree. Further, in the truncated Huffman coding, once a set of source symbols is received, a hypothetical symbol may be generated. Further, probability of the hypothetical symbol may be equal to sum of probability of less probable symbols, from the set of symbols. Further, the Huffman coding technique may be used to assign bit code to the hypothetical symbol and the most probable symbols, from the set of source symbols.

In both the Huffman coding technique and the truncated Huffman coding technique the Huffman tree needs to be generated. The process of Huffman tree generation requires multiple iterations. Further, processing memory required for data compression is more due to large number of iterations. Thus, these data compression techniques take considerable amount of time, if there exists huge amount of data. Furthermore, logical resources required for data compression using Huffman coding and Truncated Huffman coding is more due to generation of Huffman tree. Thus, the Huffman coding and Truncated Huffman coding techniques are rendered useless, when it comes to real-time compression of data.

Further, in order to overcome disadvantages of the above mentioned data compression techniques, the present subject matter discloses a system and method for data compression that can be used for real time compression of a data frame. In one embodiment, the data frame may be received from external data sources such as environmental monitoring system. The data frame may comprise a set of symbols. Once the data frame is received, a frequency of each symbol, from a set of symbols, may be identified. In one embodiment, the frequency of each symbol may correspond to number of occurrence of each symbol in the data frame. Further, the set of symbols may be sorted based on the frequency of each symbol. In one embodiment, the sorting may be in descending order of frequency of each symbol. Further, a compression gain associated with each predefined case types, from a set of predefined case types, may be computed. The compression gain may be computed based on length of symbols in the data frame, frequency of each symbol, total number of symbols in the data frame, the predefined case type and the like. Further, the compression gain associated with each predefined case type may be compared. Further, a target predefined case type may be selected based on the comparison of the compression gains. In one embodiment, the target predefined case type may correspond to Ct bits. Once the target predefined case type is selected, Ct bits compressed code may be assigned to Most Frequent symbols and 'm+Ct' bits code may be assigned to the Less Frequent Symbols. Further to assigning the bit codes, a compressed data frame may be generated. The compressed data frame may comprise a header and a sequence of compressed symbols.

In one embodiment, due to non-generation of Huffman tree the present system and method reduces the time required for performing the data compression. Furthermore, high data transfer rate is achieved since data compression takes place on the fly. Furthermore, latency of the decompression is also low due to which the decompression may work with less time delay.

The above mentioned advantages of a system and method for real-time compression of a data frame are merely exemplary of the disclosure, which may be embodied in various forms. It is to be understood that the advantages are not necessarily limited to the specific features described. Further, the network implementation of system for real-time compression of a data frame is illustrated with FIG. 1.

Referring now to FIG. 1, a network implementation 100 of a system 102 for real-time compression of a data frame is disclosed. Although the present subject matter is explained considering that the system 102 is implemented on a server, it may be understood that the system 102 may also be implemented in a variety of computing systems, such as a laptop computer, a desktop computer, a notebook, a workstation, a mainframe computer, a server, a network server, and the like. In one implementation, the system 102 may be implemented in a cloud-based environment. In one implementation, the system 102 may be enabled over a digital hardware device such as Application Specific Integrated Circuits (ASIC) and Field Programmable Gate Arrays (FPGA). Further, the digital hardware device may be configured to perform the real-time compression of the data frame. It will be understood that the system 102 may be accessed by multiple users through one or more user devices 104-1, 104-2 . . . 104-N, collectively referred to as user device 104 hereinafter, or applications residing on the user device 104. Examples of the user device 104 may include, but are not limited to, a portable computer, a personal digital assistant, a handheld device, and a workstation. The user device 104 may be communicatively coupled to the system 102 through a network 106.

In one implementation, the network 106 may be a wireless network, a wired network or a combination thereof. The network 106 may be implemented as one of the different types of networks, such as intranet, local area network (LAN), wide area network (WAN), the internet, and the like. The network 106 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further, the network 106 may include a variety of network devices, including routers, bridges, servers, computing devices, storage devices, and the like.

In one embodiment, the system 102 may be configured to receive a data frame. The data frame may comprise a set of symbols. Once the set of symbols are received, the system 102 may be configured to identify frequency associated with each symbol, from the set of symbols. In one embodiment, the frequency may be identified by counting a number of occurrence of each symbol in the data frame. Further to the identification of the frequency, the system 102 may generate a sorted set of symbols based on frequency of each symbol. In one aspect, the set of symbols may be sorted in descending order of the frequency, associated with each symbol, from the set of symbols.

Further, the system 102 may compute a compression gain. The compression gain may be associated with each predefined case type, from a set of predefined case types. In one example, the compression gain may be computed using length of each symbol (m), the predefined case type, the number of symbols in the data frame, and the frequency of each symbol in the data frame. In one embodiment, each predefined case type may correspond to a number of bits (C). The number of bits (C) may be used to represent the first $(2^C-1)$ symbols, from the sorted set of symbols. In one example, first $(2^C-1)$ symbols, from the sorted set of symbols, may correspond to Most Frequent Symbols (MFS) and remaining symbols, from the sorted set of symbols, may correspond to Less Frequent Symbols (LFS).

Once the compression gain is computed, the system 102 may be configured to compare the compression gain associated with each predefined case type. Based on the comparison of the compression gain, the system 102 may select a target predefined case type, from the set of predefined case type. In one embodiment, the target predefined case type may correspond to Ct bits. Further, the system 102 may assign Ct bits compressed code to the first $(2^{Ct}-1)$ symbols. Furthermore, the system 102 may assign (m+Ct) bits code to the remaining symbols, from the sorted set of symbols.

Once the bit code is assigned, the system 102 may generate a compressed frame associated with the data frame. The compressed frame may comprise a header and a sequence of compressed symbols. In one embodiment, the header may represent the target predefined case type, the first ($2^{Ct}-1$) symbols, and the compressed code assigned to the first ($2^{Ct}-1$) symbols from the sorted set of symbols. In one embodiment, instead of storing compressed code assigned to the first ($2^{Ct}-1$) symbols, the compressed code associated with the first ($2^{Ct}-1$) symbols from the sorted set of symbols may be determined based on the index information (i.e. i=0, 1, 2 . . . ) corresponding to the first ($2^{Ct}-1$) symbols from the sorted set of symbols and the target predefined case type. In one example, the compressed code associated with the first ($2^{Ct}-1$) symbols may be determined based on the index information, when the first ($2^{Ct}-1$) symbols are in intrinsic order. In one aspect, the intrinsic order may indicate natural order of the first ($2^{Ct}-1$) symbols in the sorted set of symbols. In one example, if the target predefined case type is case 3 and the first symbol and second symbol, in the first ($2^{Ct}-1$) symbols, is 'A' (01010011) followed by symbol 'E' (01010111), then the compressed code assigned to the symbol 'A' is '000' and that of symbol 'E' is '001'. In other words, instead of allocating additional bits, in the header, to represent the compressed code, the index information may be used to generate the compressed code. Further, the sequence of the compressed symbols, from the compressed frame, may represent the bit code assigned to each symbol in the data frame. Further, the system for real-time compression of the data frame is elaborated with respect to FIG. 2.

Figure 2:
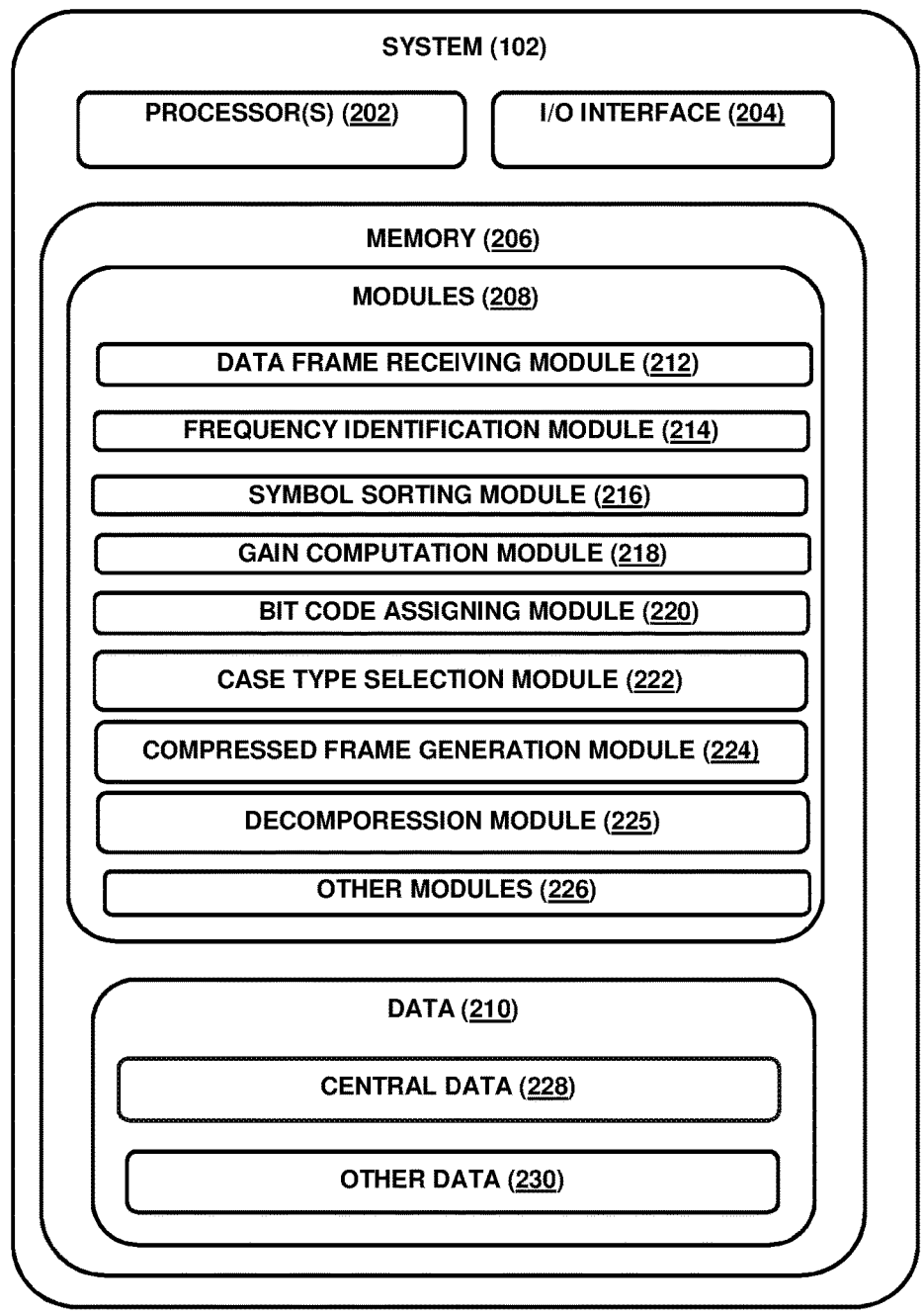
FIG. 2 illustrates the system for real-time compression of a data frame, in accordance with an embodiment of the present subject matter.

Referring now to FIG. 2, the system 102 for real-time data compression of a data frame is illustrated in accordance with an embodiment of the present subject matter. In one embodiment, the system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, at least one processor 202 may be configured to fetch and execute computer-readable instructions stored in the memory 206.

The I/O interface 204 may include a variety of software and hardware interfaces, for example, a web interface, a graphical user interface, and the like. The I/O interface 204 may allow the system 102 to interact with the user directly or through the user device 104. Further, the I/O interface 204 may enable the system 102 to communicate with other computing devices, such as web servers and external data servers (not shown). The I/O interface 204 may facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 206 may include modules 208 and data 210.

The modules 208 may include routines, programs, objects, components, data structures, and the like, which perform particular tasks, functions or implement particular abstract data types. In one implementation, the module 208 may include a data frame receiving module 212, a frequency identification module 214, a symbol sorting module 216, a gain calculation module 218, a case type selection module 220, a bit code assigning module 222, a compressed frame generation module 224, a decompression module 225, and other modules 226. The other modules 226 may include programs or coded instructions that supplement applications and functions of the system 102.

The data 210, amongst other things, serve as a repository for storing data processed, received, and generated by one or more of the modules 208. The data 210 may also include a central data 228, and other data 230. In one embodiment, the other data 230 may include data generated as a result of the execution of one or more modules in the other modules 226.

In one implementation, a user may access the system 102 via the I/O interface 204. The user may be registered using the I/O interface 204 in order to use the system 102. In one aspect, the user may access the I/O interface 204 of the system 102 for obtaining information, providing input information or configuring the system 102.

In one embodiment, the data frame receiving module 212 may be configured to receive a data frame based on user inputs. The data frame may comprise a set of symbols. In one example, length of each symbol, from the set of symbols, may be m bits. The data frame may be referred as an uncompressed data set. In one aspect, the data frame may correspond to a sequence of uncompressed symbols received from a single data channel or multiple uncompressed symbols received from parallel data channels. In one aspect, the uncompressed symbols from the parallel data channels may increase throughput of the uncompressed symbols. In one example, the throughput may correspond to amount of symbols/data transferred from a transmitter device to receiver device. In one exemplary embodiment, the data frame receiving module 212 may receive n symbols from n parallel data channels. Further, the n symbols may be combined to generate the data frame. In another example, the data frame may correspond to sequence of uncompressed symbols received from a single data channel.

Once the data frame is received, the data frame receiving module 212 may be configured to divide the data frame into shorter blocks with equal size. In one example, each shorter block or the entire data frame may comprise N symbols. In one embodiment, the data frame may be an IP packet, text file, and the like.

Further, the frequency identification module 214 may be configured to identify frequency of each symbol, from the set of symbol in the data frame. The frequency of each symbol may correspond to a number of occurrence of each symbol in the data frame. In one example, the frequency of each symbol may be identified based on counting the number of occurrence of each symbol in the data frame. In one example, the frequency of symbol may vary from 0 to N. In one aspect, the data frame may be a single symbol data frame, when the frequency of a symbol is N. In one embodiment, the frequency of the symbols, from the set of symbols, may be same or different.

Further to the identification of the frequency, the symbol sorting module 216 may be configured to sort the symbols in descending order of frequency of the symbols, from the set of symbols. Based on the sorting of the symbols, the symbol sorting module 216 may be configured to generate a sorted set of symbols. In one aspect, the order of the symbols may not be considered, when the frequency of the symbols is same. In one example, considering three symbols, from the data frame, with same frequency. In this case, these three symbols may be placed in any order in the sorted set of the symbols. In one example, the symbol sorting module 216 may be configured to generate a sorted symbol table. The sorted symbol table may comprise the sorted set of symbols based on the frequency of occurrence.

Further, the gain computation module 218 may be configured to classify the sorted set of symbols into Most Frequent Symbols (MFS) and Less Frequent Symbols (LFS). In one aspect, MFS may correspond to most frequently occurred symbols in the data frame. Further, a summation of frequency/count of MFS symbols may correspond to F_MFS. In one aspect, the LFS may correspond to Less Frequently occurred symbols in the data frame. Further, a subtraction of F_MFS from the total number of symbols in the data frame may correspond to F_LFS. Furthermore, the gain computation module 218 may be configured to compute a compression gain. The compression gain may be associated with each predefined case type, from a set of predefined case types.

Further, each predefined case type may correspond to a number of bits (C) used to represent the first $(2^C-1)$ symbols (i.e. MFS) from the sorted set of symbols. In one embodiment, if m=8, the set of predefined case type may comprise Case-1, Case-2, Case-3, Case-4, Case-5, Case-6, and Case-7. In one example, each predefined case type may be referred as a compression mode. In one embodiment, the Case-1 may correspond to one-bit code. Further, the Case-1 may be used to represent one symbol. Further, the Case-2 may correspond to two-bit code. Furthermore, the Case-2 may be used to represent two or three symbols. In one example, Case-C may correspond to C bit code. Further, the Case-C may be used to represent $(2^C-1)$ symbols. The value of C may vary from 1 to 7.

Further, the compression gain may correspond to a ratio between number of a compressed frame bytes and a number of data frame bytes (Original frame bytes). In one embodiment, the gain computation module 218 may compute the compression gain based on length of each uncompressed symbol (m), the predefined case type, the number of symbols in the data frame, and the frequency of each symbol in the data frame.

In one embodiment, the compression gain may be computed using equation 1, equation 2 and equation 3 as follow:

$$F\_MFS = \sum_{i=1}^{i=(2^{Ct}-1)} count(Xi) \quad \text{equation 1}$$

$$F\_LFS = N - F\_MFS \quad \text{equation 2}$$

$$\text{Compression Gain} = \frac{(F\_MFS \times Ct) + (F\_LFS \times (m+Ct))}{m \times N} \quad \text{equation 3}$$

Wherein,
F_MFS—Summation of count of Most Frequent Symbols
F_LFS—Summation of count of Less Frequent Symbols
Ct—Number of bits of a compressed code assigned to MFS
(m+Ct)—Number of bits of a compressed code assigned to LFS
m—length of each uncompressed symbol in a data frame
X—Symbol in the sorted set of symbols
N—Total number of symbols in the data frame In one exemplary embodiment, considering total number of symbols in the data frame as 60 (i.e. N=60). Further, length of each uncompressed symbol in the data frame is 8 (i.e. m=8). Further, the count of first symbol (X1) in the sorted set of symbols is 15. The count of second symbol (X2) in the sorted set of symbols is 10. The count of third symbol (X3) in the sorted set of symbols is 10. The count of fourth symbol (X4) in the sorted set of symbols is 10. The count of each symbol (from X5 to X15), from the remaining 15 symbols, from the sorted set of symbols, is 1. In this case, the target predefined case type is Case-3. Thus, 3-bit code is assigned to the MFS symbols. Further, 11-bit code is assigned to the LFS symbols. Further, the compression gain is computed using equation 1, equation 2 and equation 3 as follows:

According to equation 1—

$F\_MFS = (Count(X1) + Count(X2) + Count(X3) + Count(X4) + Count(X5) + Count(X6) + Count(X7))$ $F\_MFS = 15 + 10 + 10 + 10 + 1 + 1 + 1 = 48$ According to equation 2—

$F\_LFS = 60 - 48 = 12$

According to equation 3—

$$\text{Compression Gain} = \frac{(48 \times 3) + (12 \times 11)}{8 \times 60} = 276/480 = 0.575$$

In one embodiment, the compression gain associated with the predefined case types may be represented as shown in Table 1. The Table 1 may correspond to number of MFS symbols in the data frame and the compression gain.

TABLE 1

| Compression gain | |
|---|---|
| Frame Type | Compression Gain |
| 1-symbol | ⅛ |
| 2/3-symbols | <=¼ |
| 4/7-symbols | <=⅜ |
| 8/15-symbols | <=½ |
| 16/31-symbols | <=⅝ |
| 32/63-symbols | <=¾ |
| 64/127-symbols | <=⅞ |
| All symbols | <=1 |

Referring to the table 1, the compression gain associated with the data frame, comprising symbol 1, may be ⅛. Further, the compression gain associated with the data frame, comprising 2 to 3 MFS symbols, may be less than or equal to ¼. Furthermore, the compression gain associated with the data frame, comprising 4 to 7 MFS symbols, may be less than or equal to ⅜. Furthermore, the compression gain associated with the data frame, comprising 8 to 15 MFS symbols, may be less than or equal to ½. Furthermore, the compression gain associated with the data frame, comprising 16 to 31 MFS symbols, may be less than or equal to ⅝. Furthermore, the compression gain associated with the data frame, comprising 32 to 63 MFS symbols, may be less than or equal to ¾. Furthermore, the compression gain associated with the data frame, comprising 64 to 127 MFS symbols, may be less than or equal to ⅞. Furthermore, the compression gain may be less than or equal to 1, when the number of MFS symbols in the data frame is more than 127.

Once the compression gain is computed, the case type selection module 220 may be configured to compare the compression gain, associated with each predefined case type. Based on the comparison of the compression gain, the case type selection module 220 may be configured to select a target predefined case type, from the set of predefined case types. The target predefined case type may correspond to maximum compression gain achieved as compared to other predefined case types. Further, the target predefined case type may correspond to Ct bits. In one embodiment, the target predefined may be used to assign bits to the Most Frequent symbols, from the sorted set of symbols.

In one example, considering number of symbols in the data frame as 10 and the target predefined case type selected based on the maximum compression gain is Case-4. In this case, 4 bits may be used to represent MFS (first 10 symbols from the sorted set of symbols) in the data frame.

Upon selecting the target predefined case type, the bit code assigning module 222 may be configured to assign compressed code to symbols, from the sorted set of symbols. In one embodiment, the bit code assigning module 222 may assign the compressed code of Ct bits to the first (2^Ct−1) symbols, from the sorted set of symbols. Further, the bit code assigning module 222 may be configured to assign (m+Ct) bits code to the remaining symbols (i.e. LFS), from the sorted set of symbols.

In one example, considering thirty symbols present in the data frame. In one embodiment, each symbol may be of length 8 bits. Further, the target predefined case type may be case-3. Thus, first seven symbols, from the thirty symbols, may be represented with the Case-3. In this case, the bit code assigning module 222 may assign 3 bits compressed code to the first seven symbols. Further, the bit code assigning module 222 may assign 11 bits to the remaining symbols (i.e. LFS). The first three bits (i.e. 111 Bit) may represent that the preceding symbol is uncompressed and the remaining 8 bits may represent 8-bit uncompressed value of an LFS symbol.

In one embodiment, the data frame may comprise 256 symbols. Further, frequency of the 256 symbols may be similar. In this case, the compression of the data frame may not be possible, when the frequency of each symbol is same. Further, the data frame may be compressed, when difference between the frequency of the symbols is more.

In one embodiment, the data frame may comprise N equi-probable symbols. In this case, the number of bits assigned to the N symbols may be same. In one example, the compressed frame may comprise twenty equi-probable symbols in the data frame. In this case, all the twenty symbols may be represented with 5-bit code.

In one embodiment, the data frame may comprise one symbol. Thus, one bit of compressed code may be assigned to the symbol. Here, the compression gain may be equal to ⅛.

Once the compressed code is assigned, the compressed frame generation module 224 may be configured to generate a compressed frame corresponding to the data frame. Further, the compressed frame may comprise a header and a sequence of compressed symbols. In one embodiment, the header may comprise the target predefined case type, list of the first (2^Ct−1) symbols, the compressed code corresponding to the first (2^Ct−1) symbols. In one embodiment, instead of storing compressed code assigned to the first (2^Ct−1) symbols, the compressed code associated with the first (2^Ct−1) symbols from the sorted set of symbols may be determined based on the index information (i.e. i=0, 1, 2 . . . ) corresponding to the first (2^Ct−1) symbols from the sorted set of symbols. In one example, the compressed code associated with the first (2^Ct−1) symbols may be determined based on the index information, when the first (2^Ct−1) symbols are in intrinsic order. In one aspect, the intrinsic order may indicate natural order of the first (2^Ct−1) symbols in the sorted set of symbols and the target predefined case type. In one aspect, the intrinsic order may indicate natural order of the first (2^Ct−1) symbols in the sorted set of symbols. In one example, if the target predefined case type is case 3 and the first symbol and second symbol, in the first (2^Ct−1) symbols, is 'A' (01010011) followed by symbol 'E' (01010111), then the compressed code assigned to the symbol 'A' is '000' and that of symbol 'E' is '001'. In other words, instead of allocating additional bits, in the header, to represent the compressed code, the index information may be used to generate the compressed code. Further, the sequence of the compressed symbols may be generated based on the compressed code assigned to symbols in the data frame.

In one embodiment, once the compressed frame is received, the decompression module 225 may be configured to decompress the compressed frame. The decompression module 225 may be configured to identify the target predefined case type. The target predefined case type may be identified based on analysis of the header of the compressed frame. In one example, the decompression module 225 may identify the target predefined case type based on first 3 bits of the compressed frame. In one exemplary embodiment, the target predefined case type may be Case-3, when the first 3 bits of the compressed frame are '011'.

Once the predefined case type is identified, the decompression module 225 may be configured to identify the first (2^Ct−1) symbols and the compressed code, associated with the first (2^Ct−1) symbols. The first (2^Ct−1) symbols and the compressed code, associated with the first (2^Ct−1) symbols, may be identified based on the target predefined case type. In one exemplary embodiment, the predefined case type may be Case-3. Thus, the Case-3 may indicate number of first (2^Ct−1) symbol corresponds to 7. The decompression module 225 analyse the 3 bits, associated with the MFS symbols, from the compressed frame.

Further, the decompression module 225 may replace the Ct bits compressed code, from the compressed frame, with the first (2^Ct−1) symbols. Furthermore, the decompression module 225 may replace the (m+Ct) bits, from the compressed frame, with the m bits. In one embodiment, the m bits may correspond to the remaining symbols, associated with the data frame. Based on the replacement of the compressed code with the symbols, the decompression module 225 may be configured to generate the data frame. In one example, the data frame may correspond to an uncompressed data frame. The data frame may be associated with the compressed frame. Further, the communication protocol for generating a compressed \frame is elaborated with respect to FIG. 3.

Referring to the FIG. 3, the communication protocol for generating a compressed frame is illustrated. The compressed frame may comprise block 301, block 302 and block 303. Further, the block 301 and the block 302 may represent the header of the compressed frame. Furthermore, the block 303 may correspond to the sequence of the compressed symbols.

In one embodiment, the block 301 may correspond to the target predefined case type. Further, each predefined case type, from the set of predefined case type, may be represented with a 3 bits of bit code as shown in Table 2.

TABLE 2

| Case Type Representation | |
|---|---|
| Bit Coding | Compression mode |
| 000 | NC (No Compression) |
| 001 | Case-1 |
| 010 | Case-2 |
| 011 | Case-3 |
| 100 | Case-4 |
| 101 | Case-5 |
| 110 | Case-256 |
| 111 | — |

Referring to table 2, bit code 000 represents no compression mode. Further, bit code 001 may represent Case-1 (i.e. used to represent one MFS). The bit code 010 may represent Case-2 (used to represent until 3 MFS). The bit code 011 may represent Case-3 (used to represent until 7 MFS). Further, the bit code 100 may represent Case-4 (used to represent until 15 MFS). The bit code 101 may represent Case-5 (used to represent until 31 MFS). The bit code 110 may be used to represent Case-256. In one aspect, the Case-256 may be used to represent both of the Case-6 (used to represent until 63 MFS), and Case-7 (used to represent until 127 MFS).

Further, the block 302 may represent the list of the first (2^Ct−1) symbols and the compressed code assigned to the first (2^Ct−1) symbols, when the target predefined case type is from Case-1 to Case-5. In one embodiment, the length of the block 302 may be 32 bytes (i.e. 256 bits). In one exemplary embodiment, the target predefined case type may be Case-3. Thus, first seven symbols may be represented with 3 bits in the compressed frame. In this case, the block 302 may comprise the seven symbols and the compressed code of the seven symbols, such as first symbol may be represented as '000', second symbol may be represented as '001', third symbol may be represented as '010', fourth symbol may be represented as '011', fifth symbol may be represented as '100', sixth symbol may be represented as '101', and seventh symbol may be represented as '110'. Further, the remaining symbols, from the sorted set of symbols, may be represented with '111' followed by m-bit LFS original symbol.

Further, block 303 may comprise the sequence of compressed code. The sequence of compressed code may correspond to the compressed code of the MFS and the bit code of the LFS. In one example, the data frame may comprise 25 symbols. Further, the target predefined case type may be Case-3. In this case, the block 303 may comprise the compressed code assigned to first seven symbols and the bit code associated with the remaining eighteen symbols. Further, the 256-bit array used to represent header of Case-6 and Case-7 in the compressed frame is elaborated with respect to FIG. 4.

Figure 4:
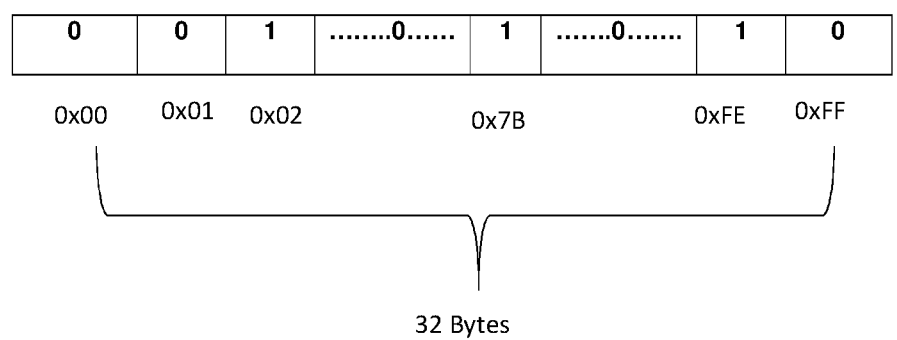
FIG. 4 illustrates 256-bit array used to represent header of Case-6 and Case-7 in a compressed frame, in accordance with an embodiment of the present subject matter.

Referring now to FIG. 4, 256-bit array for representing header of Case-6 and Case-7 is illustrated. The 256-bit array may be used to represent the Case-6 and the Case-7 in the header of the compressed frame (i.e. block 302 of the compressed frame). In the 256-bit array, presence of every symbol may be marked as one (1) of $k^{th}$ term. And absence of symbol may be marked as zero (0) of the $k^{th}$ bit. In one embodiment, the term k may correspond to array index number, associated with binary 8-bit symbol code. Further, at the time of decompression, a counter for each bit, marked as '1', may be increased. Further, the count values corresponding to each $k^{th}$ symbol may be used to decode the symbol, from the data frame. In one aspect, the decompression may extract each MFS codification, based on counting the hot bit of the header. In this case, the header size for Case-6 and Case-7 may reduce to 32 bytes from 63 and 127 bytes respectively. Further, method for real-time compression of a data frame is illustrated with respect to FIG. 5.

Figure 5:
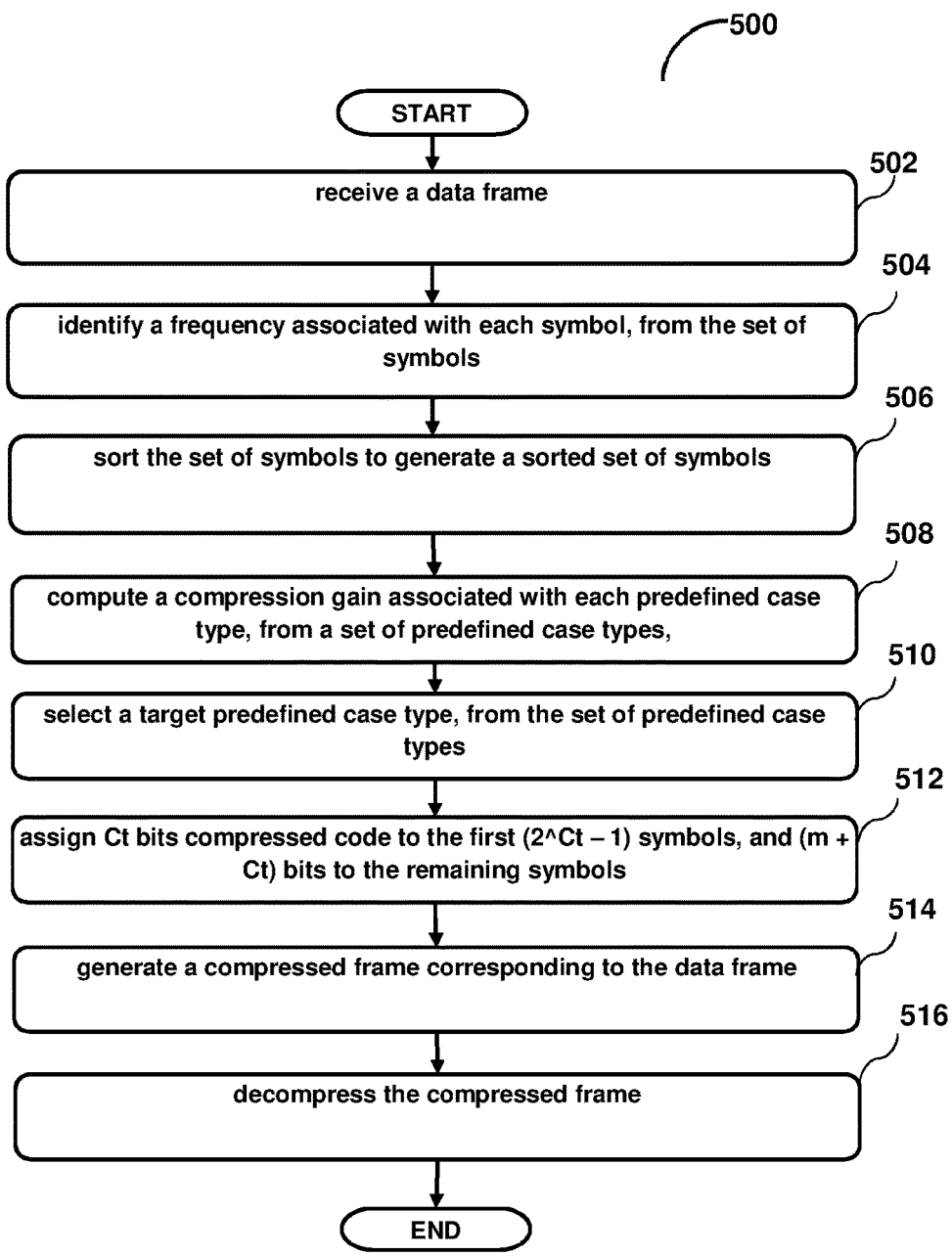
FIG. 5 illustrates a method for real-time compression of a data frame, in accordance with an embodiment of the present subject matter.

Referring now to FIG. 5, a method 500 for real-time compression of the data frame, is disclosed in accordance with an embodiment of the present subject matter. The method 500 may be described in the general context of computer executable instructions. Generally, computer executable instructions can include routines, programs, objects, components, data structures, procedures, modules, functions, and the like, that perform particular functions or implement particular abstract data types. The method 500 may also be practiced in a distributed computing environment where functions are performed by remote processing devices that are linked through a communications network. In a distributed computing environment, computer executable instructions may be located in both local and remote computer storage media, including memory storage devices.

The order in which the method 500 is described is not intended to be construed as a limitation, and any number of the described method blocks can be combined in any order to implement the method 500 or alternate methods. Additionally, individual blocks may be deleted from the method 500 without departing from the spirit and scope of the subject matter described herein. Furthermore, the method 500 can be implemented in any suitable hardware, software, firmware, or combination thereof. In one implementation, the method 500 may be implemented over a digital hardware device such as Application Specific Integrated Circuits (ASIC) and Field Programmable Gate Arrays (FPGA). However, for ease of explanation, in the embodiments described below, the method 500 may be considered to be implemented in the above described system 102.

At block 502, the data frame receiving module 212 may receive a data frame based on user inputs. The data frame may comprise a set of symbols. In one example, length of each symbol, from the set of symbols, may be m bits. In one aspect, the data frame may correspond to a sequence of uncompressed symbols received from a single data channel or multiple uncompressed symbols received from parallel data channels. In one example, the data frame receiving module 212 may receive n symbols from n parallel data channels. This n symbols may be combined to generate the data frame. In another implementation, the data frame may correspond to sequence of uncompressed symbols received from a single data channel. In one aspect, the uncompressed symbols from the parallel data channels may increase throughput of the uncompressed symbols. In one example, the throughput may correspond to amount of symbols/data transferred from a transmitter device to receiver device. The data frame may be referred as an uncompressed data set. In one embodiment, the data frame may be a IP packet, text file, and the like.

At block 504, the frequency identification module 214 may identify frequency of each symbol, from the set of symbol in the data frame. The frequency of each symbol may correspond to a number of occurrence of each symbol in the data frame. In one example, the frequency of each symbol may be identified based on counting the number of occurrence of each symbol in the data frame.

At block 506, the symbol sorting module 216 may sort the symbols in descending order of frequency of the symbols, from the set of symbols. Based on the sorting of the symbols, the symbol sorting module 216 may be configured to generate a sorted set of symbols. In one aspect, the order of the symbols may not be considered, when the frequency of the symbols is same. In one example, considering three symbols, from the data frame, with same frequency. In this case, these three symbols may be placed in any order in the sorted set of the symbols. In one example, the symbol sorting module 216 may be configured to generate a sorted symbol table. The sorted symbol table may comprise the sorted set of symbols based on the frequency of occurrence.

At block 508, the gain computation module 218 may be configured to classify the sorted set of symbols into Most Frequent Symbols (MFS) and Less Frequent Symbols (LFS). In one aspect, MFS may correspond to most frequently occurred symbols in the data frame. Further, a summation of frequency/count of MFS symbols may correspond to F_MFS. In one aspect, the LFS may correspond to less frequently occurred symbols in the data frame. Further, a subtraction of F_MFS from the total number of symbols in the data frame may correspond to F_LFS. Further, the gain computation module 218 may be configured to compute a compression gain. The compression gain may be associated with each predefined case type, from a set of predefined case types. Further, each predefined case type may correspond to a number of bits (C) used to represent the first ($2^C-1$) symbols (i.e. MFS) from the sorted set of symbols. Furthermore, the compression gain may correspond to a ratio between number of a compressed frame bytes and a number of data frame bytes (Original frame bytes). In one embodiment, the gain computation module 218 may compute the compression gain based on length of each symbol (m), the predefined case type, the number of symbols in the data frame, and the frequency of each symbol in the data frame.

At block 510, the case type selection module 220 may compare the compression gain, associated with each predefined case type. Based on the comparison of the compression gain, the case type selection module 220 may be configured to select a target predefined case type, from the set of predefined case types. The target predefined case type may correspond to maximum compression gain achieved as compared to other predefined case types. Further, the target predefined case type may correspond to Ct bits. In one embodiment, the target predefined may be used to assign bits to the Most Frequent symbols, from the sorted set of symbols.

At block 512, the bit code assigning module 222 may assign compressed code to symbols, from the sorted set of symbols. In one embodiment, the bit code assigning module 222 may assign the compressed code of Ct bits to the first ($2^{Ct}-1$) symbols, from the sorted set of symbols. Further, the bit code assigning module 222 may be configured to assign (m+Ct) bits code to the remaining symbols (i.e. LFS), from the sorted set of symbols.

At block 514, the compressed frame generation module 224 may generate a compressed frame corresponding to the data frame. Further, the compressed frame may comprise a header and a sequence of compressed symbols. In one embodiment, the header may comprise the target predefined case type, list of the first ($2^{Ct}-1$) symbols. and the compressed code corresponding to the first ($2^{Ct}-1$) symbols. In one embodiment, instead of storing compressed code assigned to the first ($2^{Ct}-1$) symbols, the compressed code associated with the first ($2^{Ct}-1$) symbols from the sorted set of symbols may be determined based on the index information (i.e. i=0, 1, 2 . . . ) corresponding to the first ($2^{Ct}-1$) symbols from the sorted set of symbols and the target predefined case type. In one example, the compressed code associated with the first ($2^{Ct}-1$) symbols may be determined based on the index information, when the first ($2^{Ct}-1$) symbols are in intrinsic order. In one aspect, the intrinsic order may indicate natural order of the first ($2^{Ct}-1$) symbols in the sorted set of symbols. In one example, if the target predefined case type is case 3 and the first symbol and second symbol, in the first ($2^{Ct}-1$) symbols, is 'A' (01010011) followed by symbol 'E' (01010111), then the compressed code assigned to the symbol 'A' is '000' and that of symbol 'E' is '001'. In other words, instead of allocating additional bits, in the header, to represent the compressed code, the index information may be used to generate the compressed code. Further, the sequence of the compressed symbols may be generated based on the compressed code assigned to symbols in the data frame.

At block 516, the decompression module 225 may be configured to decompress the compressed frame. The decompression module 225 may be configured to identity the target predefined case type based on analysis of the header of the compressed frame. Further, the decompression module 225 may be configured to identify the first ($2^{Ct}-1$) symbols and the compressed code, associated with the first ($2^{Ct}-1$) symbols. The first ($2^{Ct}-1$) symbols and the compressed code, associated with the first ($2^{Ct}-1$) symbols, may be identified based on the target predefined case type. Further, the decompression module 225 may replace the Ct bits compressed code, from the compressed frame, with the first ($2^{Ct}-1$) symbols. Furthermore, the decompression module 225 may replace the (m+Ct) bits, from the compressed frame, with the m bits. In one embodiment, the m bits may correspond to the remaining symbols, associated with the data frame. Based on the replacement of the compressed code with the symbols, the decompression module 225 may be configured to generate the data frame, associated with the compressed frame.

Although implementations for systems and methods for real-time compression of a data frame have been described, it is to be understood that the appended claims are not necessarily limited to the specific features or methods described. Rather, the specific features and methods are disclosed as examples of implementations for real-time compression of a data frame.

I claim:

1. A method for real-time compression of a data frame, the method comprises:
   receiving, by a processor, a data frame, wherein the data frame comprises a set of symbols, wherein the length of each symbol is m bits;
   identifying, by the processor, a frequency associated with each symbol, from the set of symbols, wherein for each symbol, the frequency corresponds to a number of occurrence of the symbol in the data frame;
   sorting, by the processor, the set of symbols to generate a sorted set of symbols, based on descending order of frequency associated with each symbol from the set of symbols;
   computing, by the processor, a compression gain associated with each predefined case type, from a set of predefined case types, wherein each predefined case type corresponds to a number of bits (C) used for representing first ($2^C-1$) symbols from the sorted set of symbols;
   selecting, by the processor, a target predefined case type, from the set of predefined case types, based on comparison of the compression gain associated with each predefined case type, wherein the target predefined case type corresponds to Ct bits;
   assigning, by the processor, Ct bits compressed code to the first ($2^{Ct}-1$) symbols, from the sorted set of symbols, and (m+Ct) bits code to the remaining symbols from the sorted list of symbols; and generating, by the processor, a compressed frame, wherein the compressed frame comprises a header and a sequence of compressed symbols, wherein the sequence of compressed symbols is generated based on the bit code assigned to each symbol, and wherein the header represents the target predefined case type, and the first ($2^{Ct}-1$) symbols.

2. The method of claim 1, wherein the processor is associated with a digital hardware device selected from Application Specific Integrated Circuits (ASIC) and Field Programmable Gate Arrays (FPGA).

3. The method of claim 1, wherein the data frame is generated based on a sequence of uncompressed symbols received from a single data channel or multiple uncompressed symbols, each symbol received from parallel data channels.

4. The method of claim 1, wherein the compression gain associated with each predefined case type is computed based on the length of each symbol (m), the predefined case type, the number of symbols in the data frame, and the frequency of each symbol in the data frame.

5. The method of claim 1, wherein the first ($2^{C}-1$) symbols from the sorted set of symbols correspond to Most Frequent Symbols (MFS) and remaining symbols corresponds to Less Frequent Symbols (LFS) from the sorted set of symbols.

6. The method of claim 1, wherein the compressed code associated with the first ($2^{Ct}-1$) symbols is determined based on index information corresponding to the first ($2^{Ct}-1$) symbols, when the first ($2^{Ct}-1$) symbols are in intrinsic order.

7. The method of claim 1, further comprises decompressing the compressed frame by receiving, the compressed frame;

identifying, the target predefined case type based on analysis of the header in the compressed frame;

identifying, the first ($2^{Ct}-1$) symbols and the compressed code, associated with the first ($2^{Ct}-1$) symbols, from the compressed frame, based on the target predefined case type; and generating the data frame associated with the compressed frame by replacing, the Ct bits compressed code, from the sequence of compressed symbols, of the compressed frame, with the first ($2^{Ct}-1$) symbols; and replacing, the (m+Ct) bits code, from the sequence of compressed symbols, of the compressed frame, with the m bits, wherein the m bits corresponds to the remaining symbol.

8. A system for real time compression of a data frame, the system comprising:

a memory;

a processor coupled to the memory, wherein the processor is configured to execute programmed instructions stored in the memory to:

receive a data frame, wherein the data frame comprises a set of symbols, wherein the length of each symbol is m bits;

identify a frequency associated with each symbol, from the set of symbols, wherein for each symbol, the frequency corresponds to a number of occurrence of the symbol in the data frame;

sort the set of symbols to generate a sorted set of symbols, based on descending order of frequency associated with each symbol from the set of symbols;

compute a compression gain associated with each predefined case type, from a set of predefined case types, wherein each predefined case type corresponds to a number of bits (C) used for representing first ($2^{C}-1$) symbols from the sorted set of symbols;

select a target predefined case type, from the set of predefined case types, based on comparison of the compression gain associated with each predefined case type, wherein the target predefined case type corresponds to Ct bits;

assign Ct bits compressed code to the first ($2^{Ct}-1$) symbols, from the sorted set of symbols, and (m+Ct) bits code to the remaining symbols from the sorted set of symbols; and generate a compressed frame, wherein the compressed frame comprises a header and a sequence of compressed symbols, wherein the sequence of compressed symbols is generated based on the bit code assigned to each symbol, and wherein the header represents the target predefined case type, and the first ($2^{Ct}-1$) symbols.

9. The system of claim 8, wherein the memory and the processor are enabled over a digital hardware device selected from Application Specific Integrated Circuits (ASIC) and Field Programmable Gate Arrays (FPGA).

10. The system of claim 8, wherein the data frame is generated based on a sequence of uncompressed symbols received from a single data channel or multiple uncompressed symbols, each symbol received from parallel data channels.

11. The system of claim 8, wherein the compression gain associated with each predefined case type is computed based on the length of each symbol (m), the predefined case type, the number of symbols in the data frame, and the frequency of each symbol in the data frame.

12. The system of claim 8, wherein the first ($2^{C}-1$) symbols from the sorted set of symbols correspond to Most Frequent Symbols (MFS) and remaining symbols corresponds to Less Frequent Symbols (LFS) from the sorted set of symbols.

13. The system of claim 8, wherein the compressed code associated with the first ($2^{Ct}-1$) symbols is determined based on index information corresponding to the first ($2^{Ct}-1$) symbols, when the first ($2^{Ct}-1$) symbols are in intrinsic order.

14. The system of claim 8, further configured to decompress the compressed frame by receiving, the compressed frame; identifying, the target predefined case type based on analysis of the header in the compressed frame;

identifying, the first ($2^{Ct}-1$) symbols and the compressed code, associated with the first ($2^{Ct}-1$) symbols, from the compressed frame, based on the target predefined case type; and generating the data frame associated with the compressed frame by replacing, the Ct bits compressed code, from the sequence of compressed symbols, of the compressed frame, with the first ($2^{Ct}-1$) symbols; and replacing, the (m+Ct) bits code, from the sequence of compressed symbols, of the compressed frame, with the m bits, wherein the m bits corresponds to the remaining symbol.

15. A computer program product having embodied thereon a computer program for real-time compression of a data frame, the computer program product comprises:

a program code for receiving a data frame, wherein the data frame comprises a set of symbols, wherein the length of each symbol is m bits;

a program code for identifying a frequency associated with each symbol, from the set of symbols, wherein for each symbol, the frequency corresponds to a number of occurrence of the symbol in the data frame;

a program code for sorting the set of symbols to generate a sorted set of symbols, based on descending order of frequency associated with each symbol from the set of symbols;

a program code for computing a compression gain associated with each predefined case type, from a set of predefined case types, wherein each predefined case type corresponds to a number of bits (C) used for representing first (2^C−1) symbols from the sorted set of symbols;

a program code for selecting a target predefined case type, from the set of predefined case types, based on comparison of the compression gain associated with each predefined case type, wherein the target predefined case type corresponds to Ct bits;

a program code for assigning Ct bits compressed code to the first (2^Ct−1) symbols, from the sorted set of symbols, and (m+Ct) bits code to the remaining symbols from the sorted set of symbols; and a program code for generating a compressed frame, wherein the compressed frame comprises a header and a sequence of compressed symbols, wherein the sequence of compressed symbols is generated based on the bit code assigned to each symbol, and wherein the header represents the target predefined case type, and the first (2^Ct−1) symbols.

* * * * *